United States Patent
Hung et al.

(10) Patent No.: US 7,710,151 B2
(45) Date of Patent: May 4, 2010

(54) LEVEL SHIFTER CIRCUIT

(75) Inventors: Kei-Kang Hung, Fenyuan Township, Changhua County (TW); Wu-Sung Li, Jhubei (TW)

(73) Assignee: Raydium Semiconductor Corporation, Hsinchu (TW)

( * ) Notice: Subject to any disclaimer, the term of this patent is extended or adjusted under 35 U.S.C. 154(b) by 0 days.

(21) Appl. No.: 12/256,873

(22) Filed: Oct. 23, 2008

(65) Prior Publication Data

US 2009/0230991 A1    Sep. 17, 2009

(30) Foreign Application Priority Data

Mar. 12, 2008  (TW) .............................. 97108649 A

(51) Int. Cl.
*H03K 19/0175*  (2006.01)
(52) U.S. Cl. ............................ 326/80; 326/68; 327/333
(58) Field of Classification Search .............. 326/62–63, 326/68, 80–83, 86; 327/333
See application file for complete search history.

(56) References Cited

U.S. PATENT DOCUMENTS

| 7,145,363 | B2 * | 12/2006 | Kim ............................. 326/68 |
| 7,239,191 | B2 * | 7/2007 | Lee ............................. 327/333 |
| 2008/0074148 | A1 * | 3/2008 | Srivastava et al. ............. 326/68 |

* cited by examiner

*Primary Examiner*—James Cho
(74) *Attorney, Agent, or Firm*—Thomas, Kayden, Horstemeyer & Risley

(57) ABSTRACT

A level shifter circuit includes a level shifter, an inverter, a first switch circuit and a second switch circuit. The level shifter includes a first transistor, a second transistor, a third transistor and a fourth transistor. The inverter receives an input signal and thus generates an inversion input signal. The first transistor and the second transistor are respectively controlled by the input signal and an output signal to output an inversion output signal. The third transistor and the fourth transistor are respectively controlled by the inversion input signal and the inversion output signal to output an output signal. The first switch circuit is coupled to the level shifter and turns off the fourth transistor when the third transistor is turned on. The second switch circuit is coupled to the level shifter, and turns off the second transistor when the first transistor is turned on.

12 Claims, 8 Drawing Sheets

LEVEL SHIFTER CIRCUIT

This application claims the benefit of Taiwan application Serial No. 97108649, filed Mar. 12, 2008, the subject matter of which is incorporated herein by reference.

BACKGROUND OF THE INVENTION

1. Field of the Invention

The invention relates in general to a level shifter circuit, and more particularly to a level shifter circuit capable of increasing a shifting-speed and decreasing a short current.

2. Description of the Related Art

FIG. 1 (Prior Art) is a circuit diagram showing a conventional level shifter circuit 10. Referring to FIG. 1, the conventional level shifter circuit 10 includes a level shifter 110 and an inverter 120. The inverter 120 receives an input signal IN and inverts the input signal IN into an inversion input signal IN' to be outputted to the level shifter 110. The inverter 120 includes a transistor P3 and a transistor N3, which are respectively a P-type metal oxide semiconductor (PMOS) transistor and an N-type metal oxidation semiconductor (NMOS) transistor. The control terminal of the transistor P3 is coupled to the control terminals of the transistor N3 and a transistor N1, and the second terminal of the transistor P3 is coupled to the first terminal of the transistor N3 and the control terminal of a transistor N2. The first terminal of the transistor P3 and the second terminal of the transistor N3 respectively receive a power voltage Vcc and a power voltage Vss.

The level shifter 110 outputs an output signal OUT and an inversion output signal OUT' ranging from VDD to Vss according to the levels of the input signal IN and the inversion input signal IN'. The input signal IN and the inversion input signal IN' may range from 0 to 1.8V, while VDD and Vss are respectively 5V and 0V, for example.

The level shifter 110 further includes the transistor N1, a transistor P1, the transistor N2 and a transistor P2, wherein the transistor N1 and the transistor N2 are NMOS transistors, while the transistor P1 and the transistor P2 are PMOS transistors, for example. The transistor N1 and the transistor P1 are respectively controlled by the input signal IN and the output signal OUT to output the inversion output signal OUT', while the transistor N2 and the transistor P2 are respectively controlled by the inversion input signal IN' and the inversion output signal OUT' to output the output signal OUT.

The first terminals of the transistor P1 and the transistor P2 are coupled to a power voltage VDD. The second terminal of the transistor P1 is coupled to the first terminal of the transistor N1 and the control terminal of the transistor P2. The second terminal of the transistor P2 is coupled to the first terminal of the transistor N2 and the control terminal of the transistor P1. The second terminals of the transistor N1 and the transistor N2 receive the power voltage Vss. The control terminals of the transistor N1 and the transistor N2 respectively receive the input signal IN and the inversion input signal IN'.

FIG. 2 (Prior Art) shows waveforms of the input signal, the inversion input signal, the output signal and the inversion output signal of the conventional level shifter circuit. As shown in FIG. 2, the input signal IN, the inversion input signal IN', the output signal OUT and the inversion output signal OUT' are respectively represented by curves 210, 220, 230 and 240. When the input signal IN is changed from 0V to 1.8V, the output signal OUT is changed from 0V to 5V. That is, the conventional level shifter circuit 10 converts the low voltage level of 1.8V into the high voltage level of 5V for output. The inversion input signal IN' is changed from 1.8V to 0V, and the inversion output signal OUT' is changed from 5V to 0V FIG. 3 (Prior Art) shows a waveform of a short current of the conventional level shifter circuit. As shown in FIG. 3, the short current of the conventional level shifter circuit 10 is represented by the curve 310. As can be clearly understood from the curve 310, a short current $I_{DS1}$ generated by the conventional level shifter circuit 10 approaches 30 uA at the time of 4 n seconds.

In the conventional level shifter circuit 10 (see FIG. 1), however, when the transistor N1 is turned on, the short current $I_{DS1}$ flows through the transistor N1 and the transistor P1 because the transistor P1 is not turned off in time. In addition, because the transistor N1 and the transistor P1 are in the on state, the inversion output signal OUT' has the fighting phenomenon between the power voltage VDD and the power voltage Vss.

According to the same working principle, when the transistor N2 is turned on, another short current $I_{DS1}$ often flows through the transistor N2 and the transistor P2 because the transistor P2 is not turned off. In addition, because the transistor N2 and the transistor P2 are in the on state, the output signal OUT has the fighting phenomenon between the power voltage VDD and the power voltage Vss.

Consequently, the conventional level shifter circuit 10 becomes too slow, and the short current $I_{DS1}$ also causes the unessential power consumption of the level shifter circuit 10. In addition, when the power voltage Vcc is powered down and the power voltage VDD is still powered on, the higher leakage current is induced because the output signal OUT and the inversion output signal OUT' are floating.

SUMMARY OF THE INVENTION

The invention is directed to a level shifter circuit. The level shifter circuit normally works through a first switch circuit and a second switch circuit so that the invention has the following advantages.

First, the short current and the power consumption can be decreased.

Second, the fighting phenomena of the output signal and the inversion output signal between two power voltages can be reduced.

Third, the voltage transfer-speed of the level shifter circuit can be increased.

Fourth, the leakage current can be decreased.

According to the present invention, a level shifter circuit is provided. The level shifter circuit includes a level shifter, an inverter, a first switch circuit and a second switch circuit. The level shifter includes a first transistor, a second transistor, a third transistor and a fourth transistor. The inverter receives an input signal and thus generates an inversion input signal. The first transistor and the second transistor are respectively controlled by the input signal and an output signal to output an inversion output signal. The third transistor and the fourth transistor are respectively controlled by the inversion input signal and the inversion output signal to output the output signal. The first switch circuit is coupled to the level shifter and turns off the fourth transistor when the third transistor is turned on. The second switch circuit is coupled to the level shifter and turns off the second transistor when the first transistor is turned on.

The invention will become apparent from the following detailed description of the preferred but non-limiting embodiments. The following description is made with reference to the accompanying drawings.

DETAILED DESCRIPTION OF THE INVENTION

Level Shifter Circuit

Figure 4:
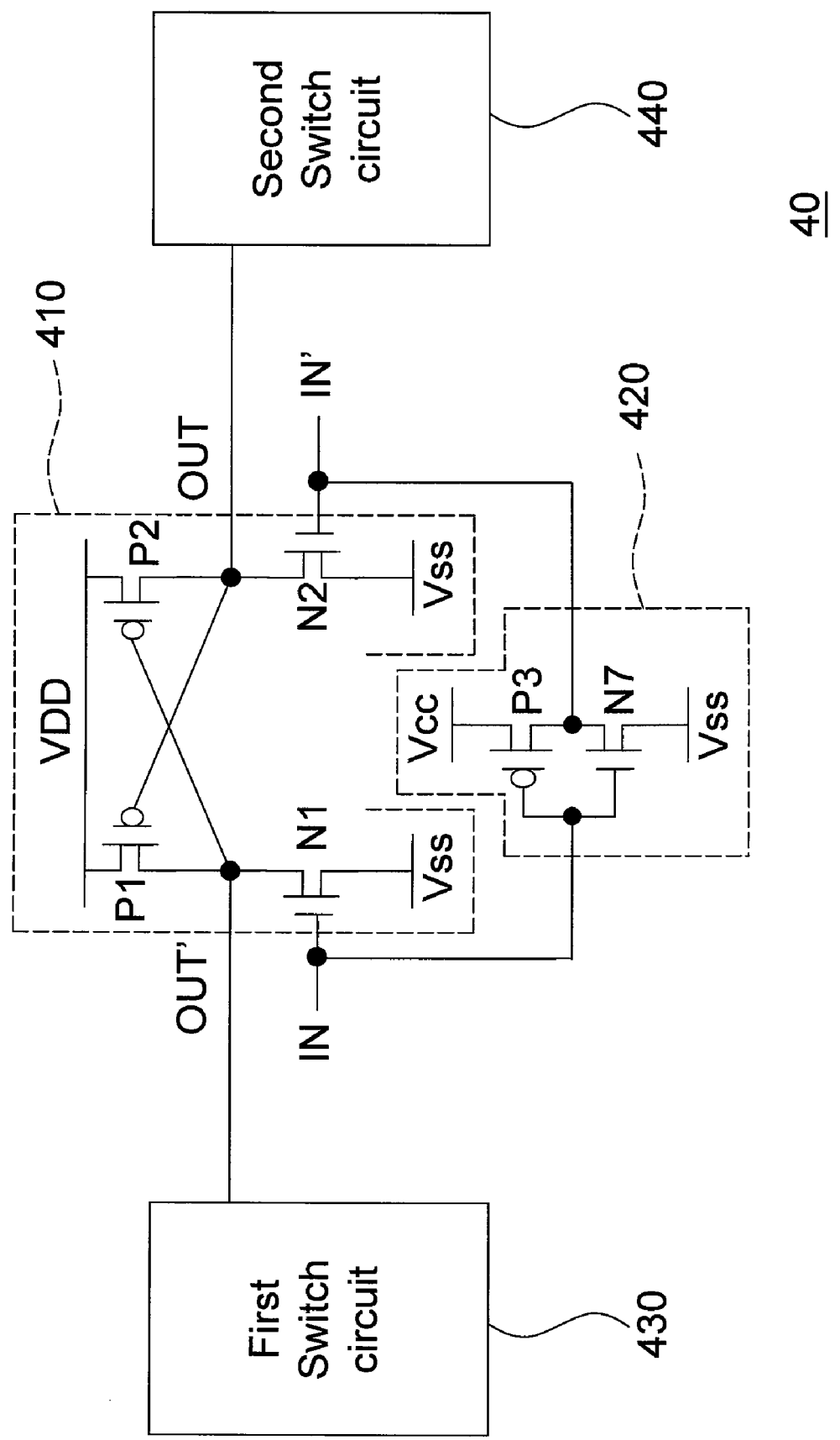
FIG. 4 is a block diagram showing a level shifter circuit according to the invention.

FIG. 4 is a block diagram showing a level shifter circuit 40 according to the invention. Referring to FIG. 4, the level shifter circuit 40 includes a level shifter 410, an inverter 420, a first switch circuit 430 and a second switch circuit 440. The inverter 420 receives an input signal IN and thus generates an inversion input signal IN'. The inverter 420 includes a transistor P3 and a transistor N7, which are respectively a PMOS transistor and an NMOS transistor. The control terminal of the transistor P3 is coupled to the control terminal of the transistor N7, and the second terminal of the transistor P3 is coupled to the first terminal of the transistor N7. The first terminal of the transistor P3 and the second terminal of the transistor N7 respectively receive a power voltage Vcc and a power voltage Vss.

The level shifter 410 outputs an output signal OUT and an inversion output signal OUT' ranging from VDD to Vss according to the levels of the input signal IN and the inversion input signal IN'. For example, the input signal IN and the inversion input signal IN' range from 0 to 1.8V, and VDD and Vss are respectively 5V and 0V.

The level shifter 410 further includes a transistor N1, a transistor P1, a transistor N2 and a transistor P2, wherein the transistor N1 and the transistor N2 are NMOS transistors while the transistor P1 and the transistor P2 are PMOS transistors, for example. The transistor N1 and the transistor P1 are respectively controlled by the input signal IN and the output signal OUT to output the inversion output signal OUT'. The transistor N2 and the transistor P2 are respectively controlled by the inversion input signal IN' and the inversion output signal OUT' to output the output signal OUT.

The first terminals of the transistor P1 and the transistor P2 are coupled to the power voltage VDD. The second terminal of the transistor P1 is coupled to the first terminal of the transistor N1 and the control terminal of the transistor P2. The second terminal of the transistor P2 is coupled to the first terminal of the transistor N2 and the control terminal of the transistor P1. The second terminals of the transistor N1 and the transistor N2 receive the power voltage Vss, and the control terminals of the transistor N1 and the transistor N2 respectively receive the input signal IN and the inversion input signal IN'.

It is to be noted that the transistor P2 cannot be normally turned off when the transistor N2 is turned on in the conventional level shifter circuit, and the transistor P1 cannot be normally turned off when the transistor N1 is turned on. In order to prevent this phenomenon from happening, the first switch circuit 430 coupled to the level shifter 410 preferably turns off the transistor P2 when the transistor N2 is turned on, and the second switch circuit 440 coupled to the level shifter 410 preferably turns off the transistor P1 when the transistor N1 is turned on.

Consequently, it is possible to avoid the voltage fighting phenomena of the output levels of the output signal OUT and the inversion output signal OUT', and it is also possible to decrease the short current and the power consumption. In addition, the output signal OUT and the inversion output signal OUT' may be coupled to a power voltage through the first switch circuit 430 and the second switch circuit 440, respectively. So, the output signal OUT and the inversion output signal OUT' are not floating and thus the leakage current is decreased.

First Embodiment

Figure 5:
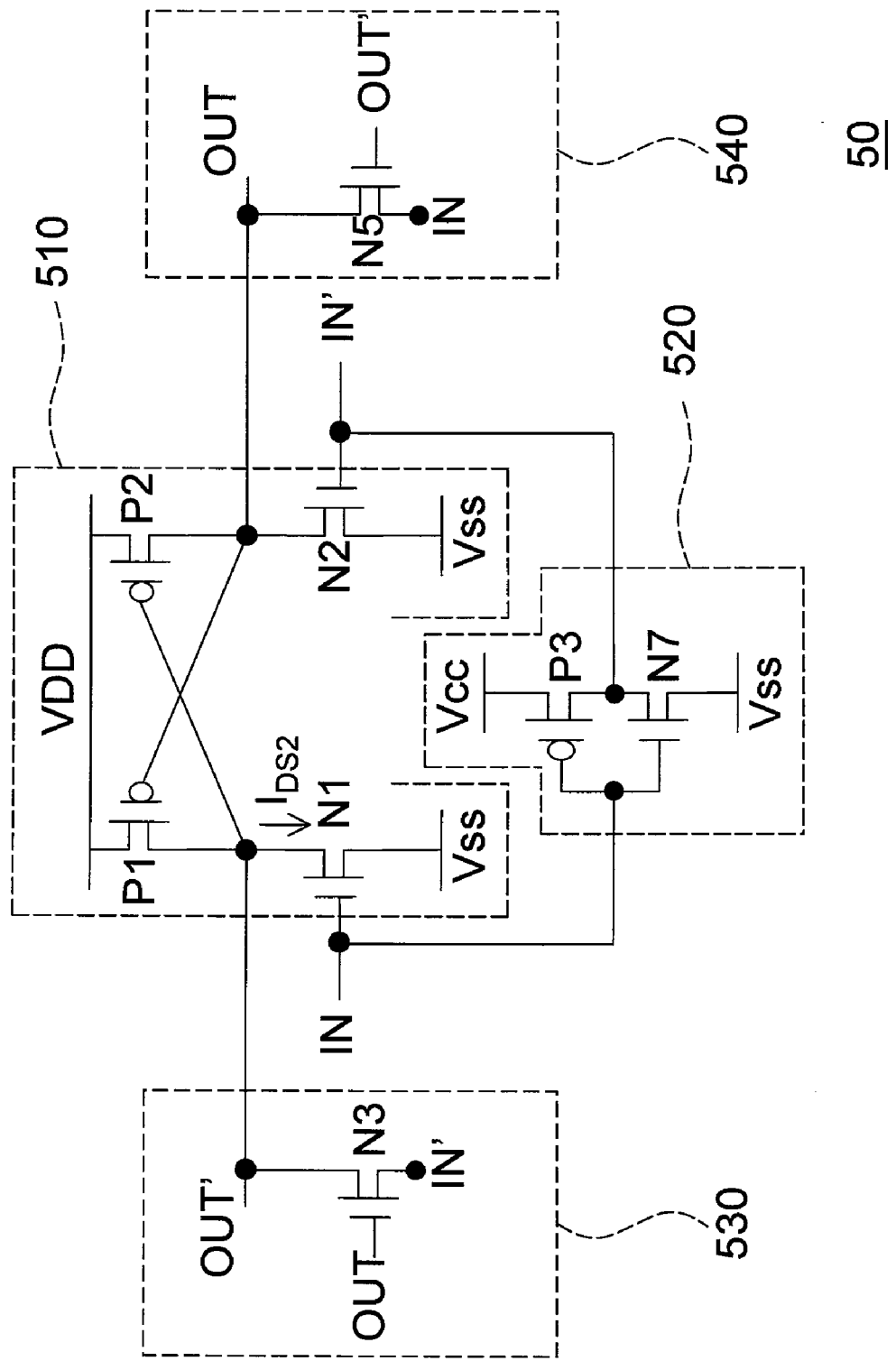
FIG. 5 is a circuit diagram showing a level shifter circuit according to a first embodiment of the invention.

FIG. 5 is a circuit diagram showing a level shifter circuit according to a first embodiment of the invention. As shown in FIG. 5, the level shifter circuit 40 and the inverter 420 are respectively represented by a level shifter circuit 50 and an inverter 520 in the first embodiment, and the first switch circuit 430 and the second switch circuit 440 are respectively represented by a first switch circuit 530 and a second switch circuit 540 in the first embodiment. For the sake of illustration, the following descriptions are made according to an example, in which the input signal IN and the inversion input signal IN' range from 0 to 1.8V, and the output signal OUT and the inversion output signal OUT' range from 0 to 5V.

The first switch circuit 530 further includes a transistor N3, such as an NMOS transistor. The first terminal of the transistor N3 is coupled to the control terminal of the transistor P2, and the second terminal of the transistor N3 receives the inversion input signal IN'. The control terminal of the transistor N3 receives the output signal OUT and is controlled by the output signal OUT. Consequently, when the input signal IN' is shifted from 0V to 3.3V, the transistor N2 is turned on. Because the inversion output signal OUT' is not yet changed to 5V, the output signal OUT is kept at 5V to turn on the transistor N3. The inversion input signal IN' is outputted to the control terminal of the transistor P2 through the transistor N3 to turn off the transistor P2 in a forced manner.

In addition, the second switch circuit 540 further includes a transistor N5 such as an NMOS transistor. The first terminal of the transistor N5 is coupled to the control terminal of the transistor P1, and the second terminal of the transistor N5 receives the input signal IN. The control terminal of the transistor N5 receives the inversion output signal OUT' and is controlled by the inversion output signal OUT'.

Consequently, when the input signal IN is shifted from 0V to 3.3V, the transistor N1 is turned on. Because the output signal OUT is not yet changed to 5V, the inversion output signal OUT' is kept at 5V to turn on the transistor N5. The input signal IN is outputted to the control terminal of the transistor P1 through the transistor N5 to turn off the transistor P1 in a forced manner.

As mentioned here in above, the first switch circuit 530 preferably turns off the transistor P2 when the transistor N2 is turned on, and the second switch circuit 540 preferably turns off the transistor P1 when the transistor N1 is turned on. Thus, it is possible to effectively prevent the voltage fighting phenomena of the output levels of the output signal OUT and the inversion output signal OUT'.

Furthermore, the inversion output signal OUT' is substantially equal to the inversion input signal IN' when the transistor N3 is turned on, and the output signal OUT is substantially equal to the input signal IN when the transistor N5 is turned on. Thus, even if the power voltage Vcc is powered down and the power voltage VDD is still powered on, the output signal OUT and the inversion output signal OUT' of the level shifter circuit 50 are not floating so that the leakage current can be effectively reduced.

Figure 2:
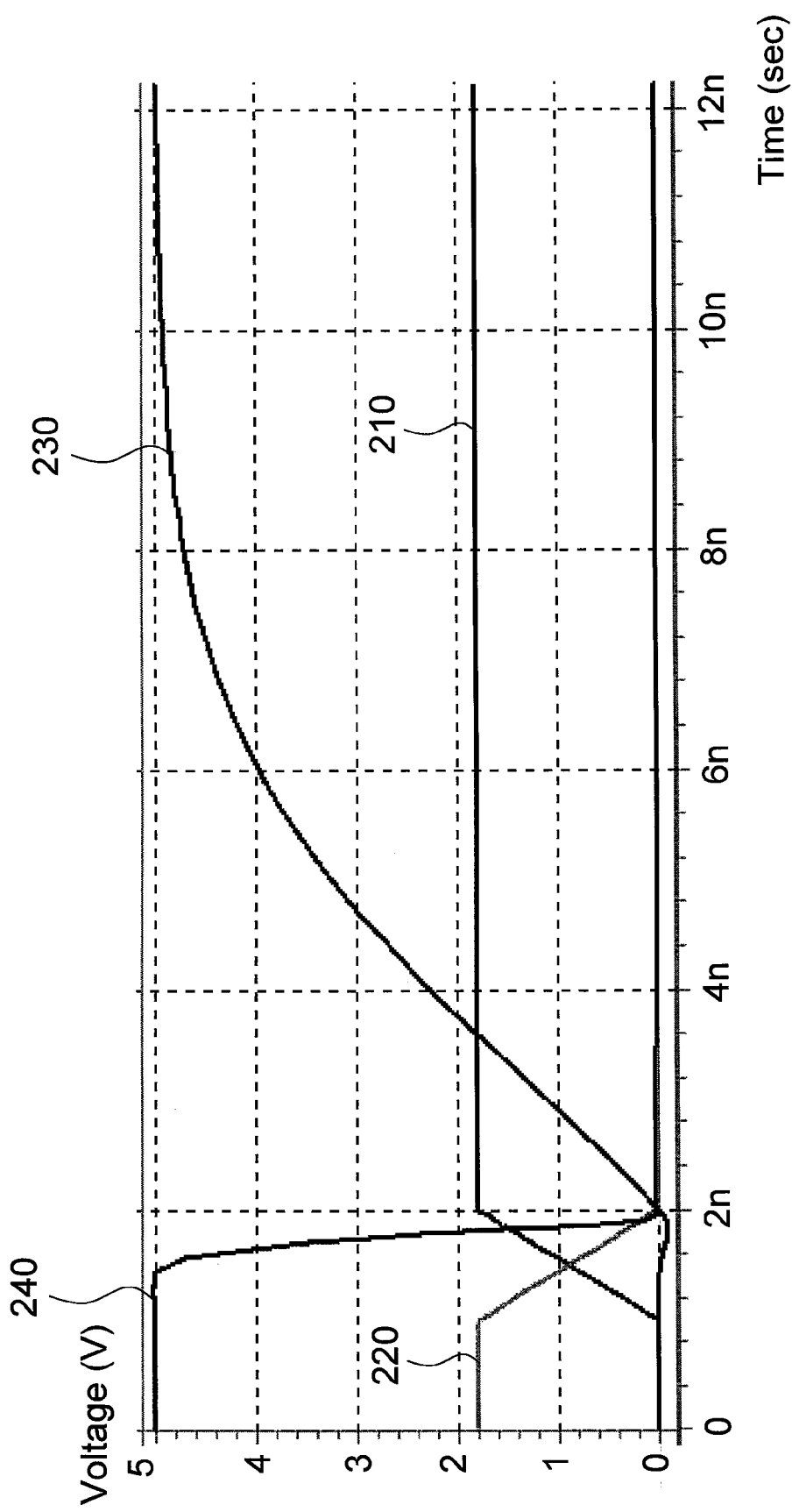
FIG. 2 (Prior Art) shows waveforms of an input signal, an inversion input signal, an output signal and an inversion output signal of the conventional level shifter circuit.
Figure 6:
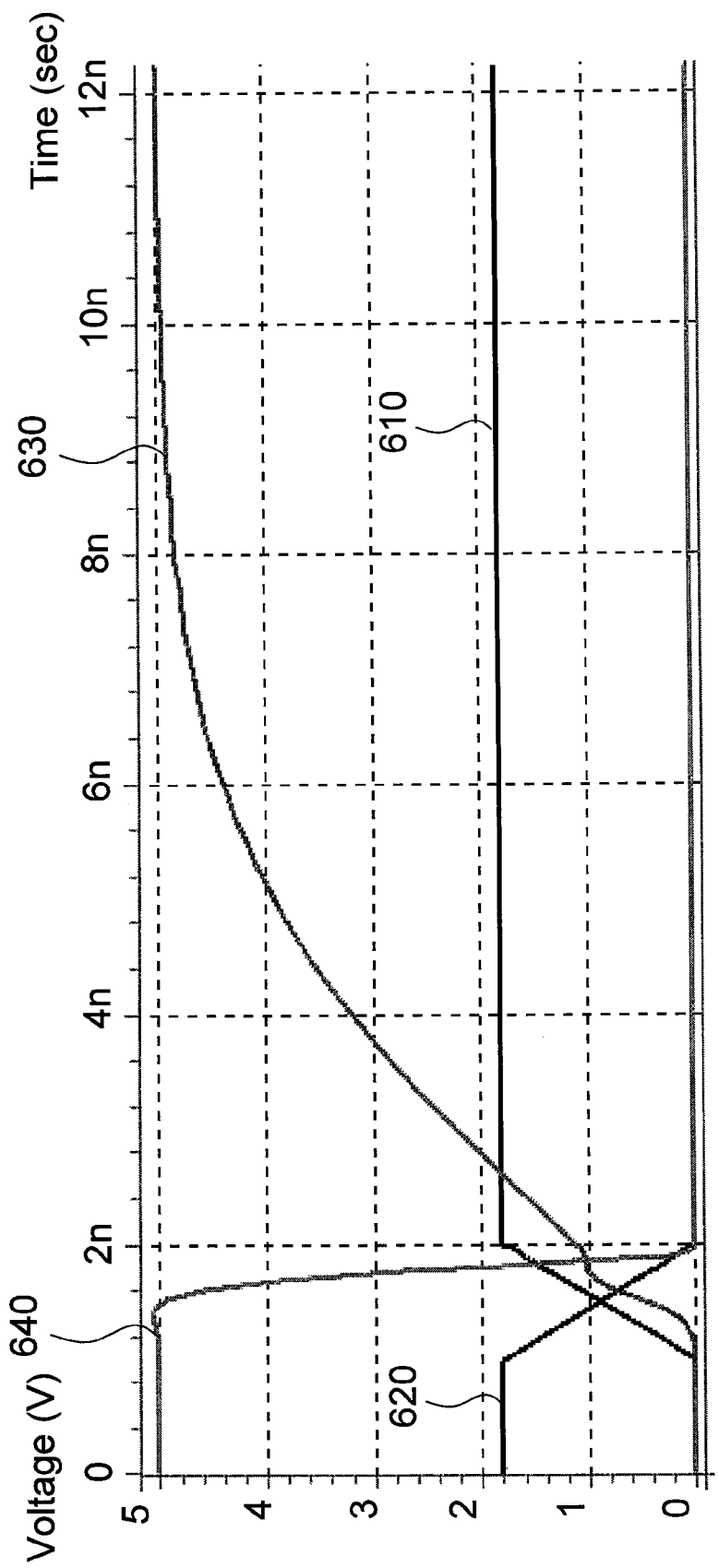
FIG. 6 shows waveforms of an input signal, an inversion input signal, an output signal and an inversion output signal according to the first embodiment of the invention.

FIG. 6 shows waveforms of the input signal, the inversion input signal, the output signal and the inversion output signal according to the first embodiment of the invention. As shown in FIGS. 2 and 6, the input signal IN, the inversion input signal IN', the output signal OUT and the inversion output signal OUT' of the first embodiment are respectively represented by curves 610, 620, 630 and 640 in FIG. 6. Compared the curve 630 of FIG. 6 with the curve 230 of FIG. 2, it can be clearly understood that the output signal OUT of the first embodiment can be shifted from 0 to 5V more rapidly than the shifting speed in the conventional level shifter circuit.

Figure 1:
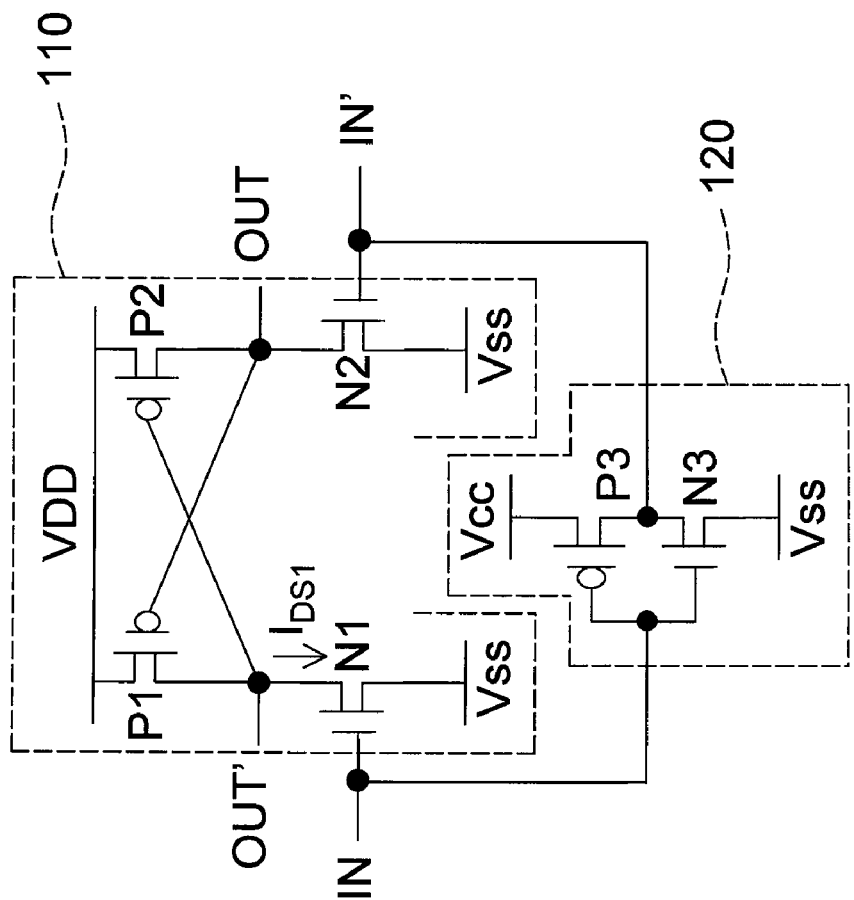
FIG. 1 (Prior Art) is a circuit diagram showing a conventional level shifter circuit.

In the conventional level shifter circuit 10, as shown in FIG. 1, the transistor P1 or the transistor P2 is not turned off in time. So, when the input signal IN is changed from 0 to 1.8V, the output signal OUT of the conventional level shifter circuit 10 is only changed from 0 to 2.5V within 4 n seconds. In the first embodiment, the first switch circuit 530 and the second switch circuit 540 turn off the transistor P1 or the transistor P2 in time. So, when the input signal IN is changed from 0 to 1.8V, the output signal OUT of the level shifter circuit 50 is rapidly changed from 0 to 3.2V within 4 n seconds. Consequently, the invention can further increase the shifting-speed of the level shifter circuit.

Figure 3:
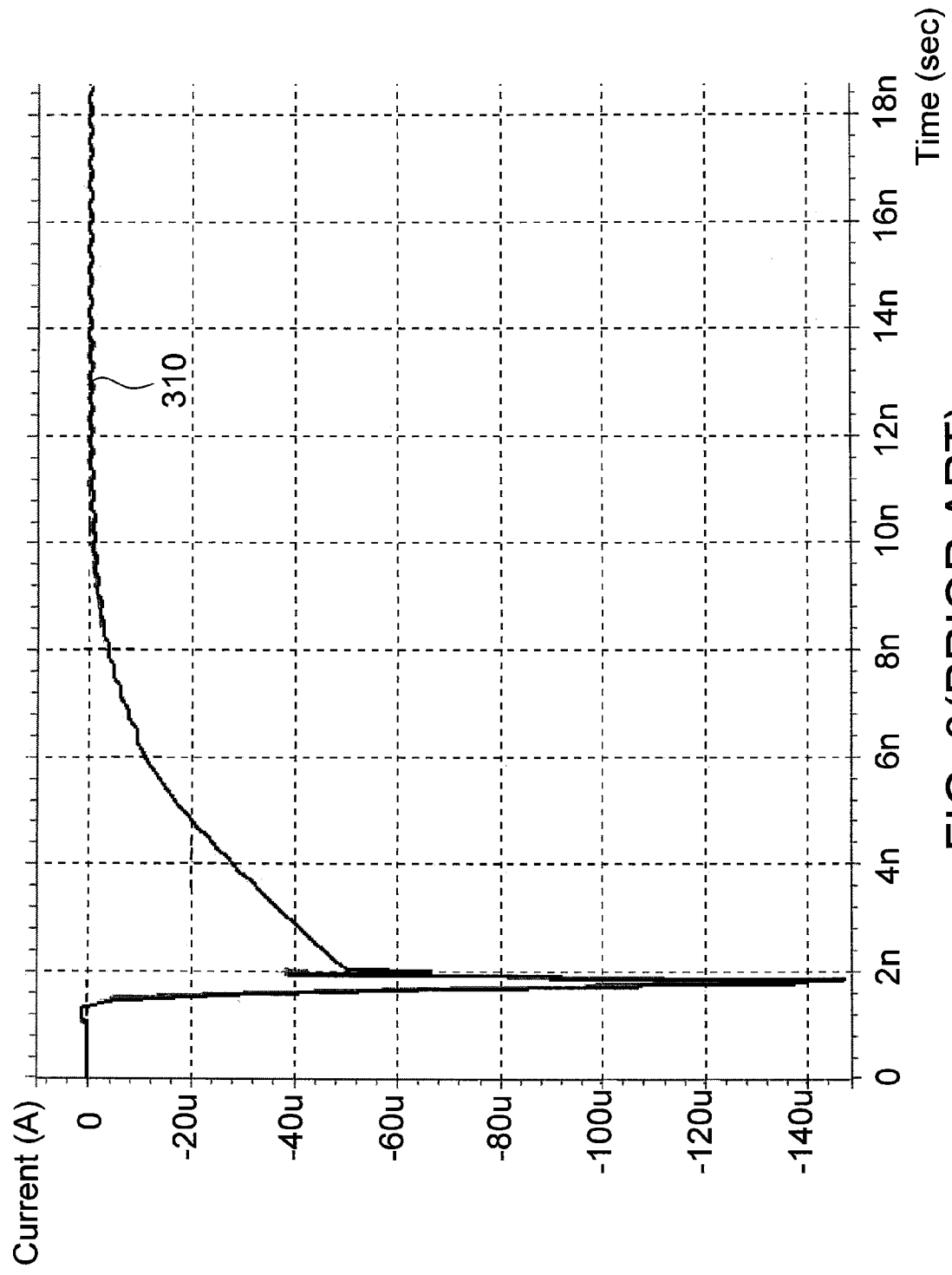
FIG. 3 (Prior Art) shows a waveform of a short current of the conventional level shifter circuit.
Figure 7:
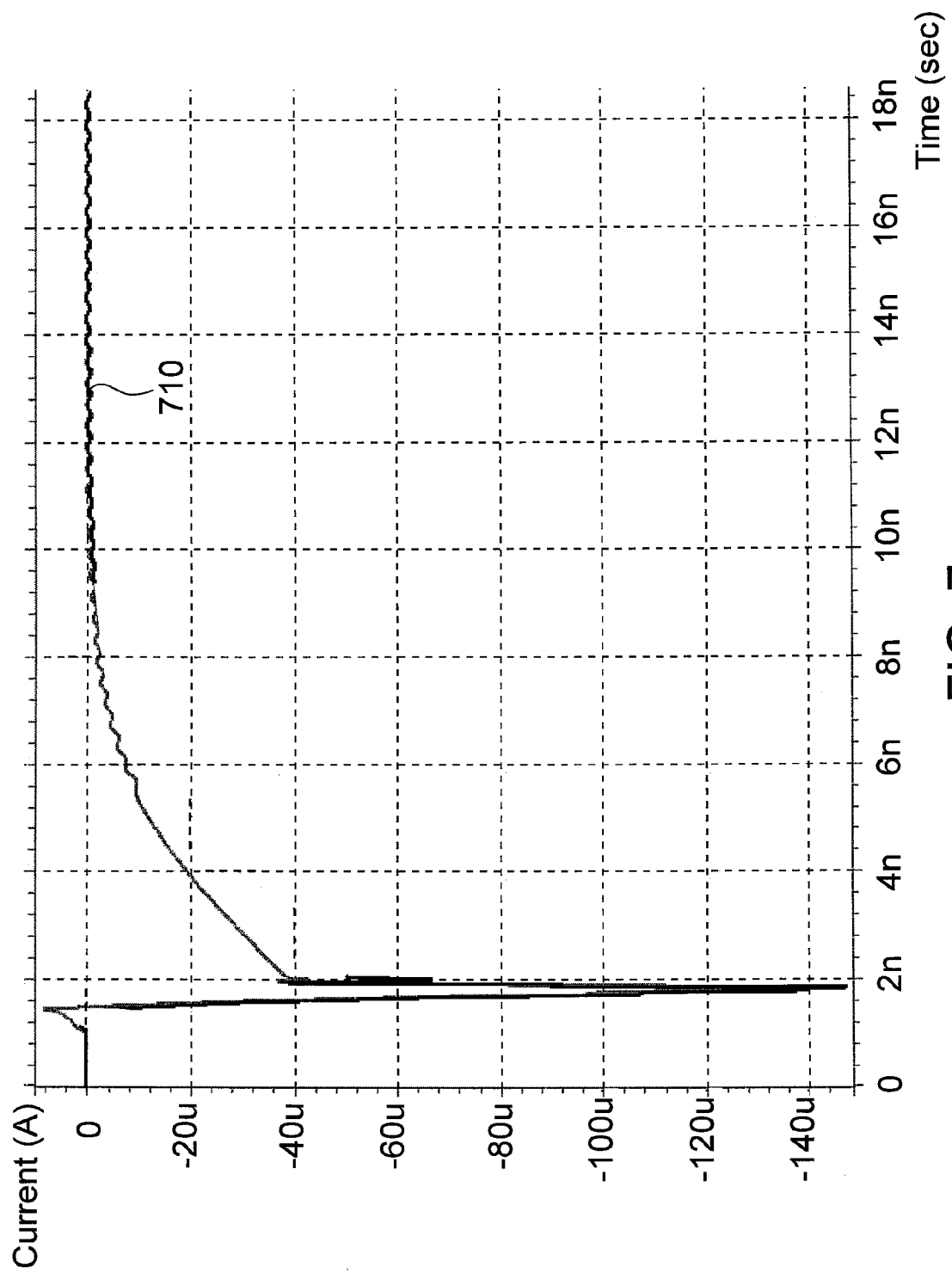
FIG. 7 shows a waveform of a short current according to the first embodiment of the invention.

FIG. 7 shows a waveform of a short current according to the first embodiment of the invention. As shown in FIGS. 3 and 7, the short current $I_{DS2}$ of the first embodiment is preferably represented by the curve 710 in FIG. 7. Compared the curve 710 of FIG. 7 with the curve 310 of FIG. 3, it can be clearly understood that the short current $I_{DS2}$ generated in the first embodiment is smaller than the short current $I_{DS1}$ generated by the conventional level shifter circuit 10.

In the conventional level shifter circuit 10, as shown in FIG. 1, the transistor P1 or the transistor P2 is not turned off in time. So, when the input signal IN is changed from 0 to 1.8V, the short current $I_{DS1}$ generated by the conventional level shifter circuit 10 at the time of 4 n seconds is 30 uA. In the first embodiment, the first switch circuit 530 and the second switch circuit 540 turn off the transistor P1 or the transistor P2 in time. So, when the input signal IN is changed from 0 to 1.8V, the short current $I_{DS2}$ generated by the level shifter circuit 50 is only equal to 20 uA. Consequently, the invention can further reduce the short current of the level shifter circuit and the power consumption.

Second Embodiment

Figure 8:
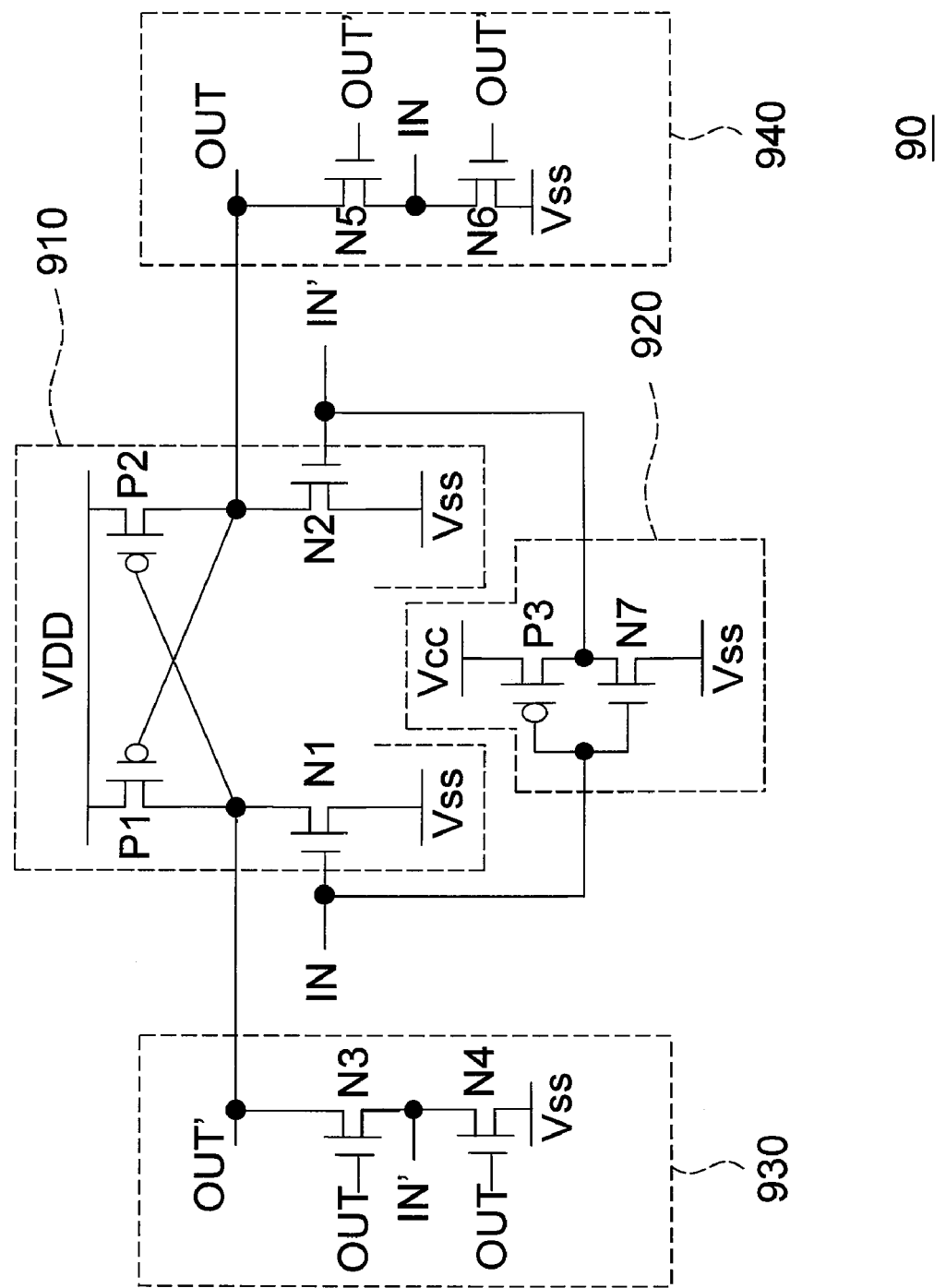
FIG. 8 is a circuit diagram showing a level shifter circuit according to a second embodiment of the invention.

FIG. 8 is a circuit diagram showing a level shifter circuit according to a second embodiment of the invention. As shown in FIG. 8, the level shifter circuit 40 and the inverter 420 are respectively represented by a level shifter circuit 90 and an inverter 920 in the second embodiment, and the first switch circuit 430 and the second switch circuit 440 are respectively represented by a first switch circuit 930 and a second switch circuit 940 in the second embodiment.

The first switch circuit 930 further includes the transistor N3 and a transistor N4, which are NMOS transistors, for example. The transistor N3 and the transistor N4 are connected in series, and the first terminal of the transistor N3 is coupled to the control terminal of the transistor P2. The second terminal of the transistor N3 is coupled to the first terminal of the transistor N4, and the second terminal of the transistor N4 receives the power voltage Vss. The control terminals of the transistor N3 and the transistor N4 receive the output signal OUT and are controlled by the output signal OUT.

Consequently, when the input signal IN' is shifted from 0 to 3.3V, the transistor N2 is turned on. Because the inversion output signal OUT' is not yet changed to 5V, the output signal OUT is kept at 5V to turn on the transistor N3. The inversion input signal IN' is outputted to the control terminal of the transistor P2 through the transistor N3 to turn off the transistor P2 in a forced manner. In addition, when the power voltage Vcc is powered down, the transistor N4 is turned on to prevent the inversion input signal IN' from floating and thus influencing the normal operation of the level shifter circuit 90. When the transistor N4 is turned on, the inversion input signal IN' is substantially equal to the power voltage Vss so that the level shifter circuit 90 works normally. The transistor N3 and the transistor N4 can make the control terminal of the transistor P2 be influenced by the inversion input signal IN' more easily by properly selecting the width-to-length ratio.

The second switch circuit 940 further includes the transistor N5 and a transistor N6, which are NMOS transistors, for example. The transistor N5 and the transistor N6 are connected in series, and the first terminal of the transistor N5 is coupled to the control terminal of the transistor P1. The second terminal of the transistor N5 is coupled to the first terminal of the transistor N6, and the second terminal of the transistor N6 receives the power voltage Vss. The control terminals of the transistor N5 and the transistor N6 receive the inversion output signal OUT' and are controlled by the inversion output signal OUT'.

Consequently, when the input signal IN is shifted from 0 to 3.3V, the transistor N1 is turned on. Because the output signal OUT is not yet changed to 5V, the inversion output signal OUT' is kept at 5V to turn on the transistor N5. The input signal IN is outputted to the control terminal of the transistor P1 through the transistor N5 to turn off the transistor P1 in a forced manner. In addition, when the transistor N6 is turned on, the input signal IN is substantially equal to the power voltage Vss to prevent the input signal IN from floating and influencing the normal operation of the level shifter circuit 90. The transistor N5 and the transistor N6 can make the control terminal of the transistor P1 be influenced by the input signal IN more easily by properly selecting the width-to-length ratio.

As mentioned hereinabove, the first switch circuit 930 preferably turns off the transistor P2 when the transistor N2 is turned on, and the second switch circuit 940 preferably turns off the transistor P1 when the transistor N1 is turned on. Thus, it is possible to effectively prevent the voltage fighting phenomena of the output levels of the output signal OUT and the inversion output signal OUT'.

In addition, the first switch circuit 930 and the second switch circuit 940 turn off the transistor P1 or the transistor P2 in time. So, the transfer speed of the level shifter circuit 90 can be increased, and the short current and the power consumption of the level shifter circuit 90 can further be reduced.

Furthermore, the inversion output signal OUT' is substantially equal to the power voltage Vss when the transistor N3 is turned on, and the output signal OUT is substantially equal to the power voltage Vss when the transistor N5 is turned on. Thus, even if the power voltage Vcc is powered down and the power voltage VDD is still powered on, the output signal OUT and the inversion output signal OUT' of the level shifter circuit 90 are not floating so that the leakage current can be effectively reduced.

The level shifter circuit according to each embodiment of the invention timely turns off the second transistor and the fourth transistor through the first switch circuit and the second switch circuit so that the invention has the following advantages.

First, the short current and the power consumption can be decreased.

Second, the fighting phenomena of the output signal and the inversion output signal between two power voltages can be avoided.

Third, the shifting-speed of the level shifter circuit can be increased.

Fourth, the leakage current can be decreased.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A level shifter circuit, comprising:
   a level shifter, comprising:
      a first transistor and a second transistor respectively controlled by an input signal and an output signal to output an inversion output signal; and
      a third transistor and a fourth transistor respectively controlled by an inversion input signal and the inversion output signal to output the output signal;
   an inverter for receiving the input signal and thus generating the inversion input signal;
   a first switch circuit, which is coupled to the level shifter and turns off the fourth transistor when the third transistor is turned on, wherein the first switch circuit comprises:
      a fifth transistor controlled by the output signal to output the inversion input signal to the fourth transistor to turn off the fourth transistor; and
   a second switch circuit, which is coupled to the level shifter and turns off the second transistor when the first transistor is turned on.

2. The level shifter circuit according to claim 1, wherein the fifth transistor has a control terminal for receiving the output signal, a first terminal coupled to a control terminal of the fourth transistor, and a second terminal for receiving the inversion input signal.

3. The level shifter circuit according to claim 1, wherein the fifth transistor is an N-type metal oxidation semiconductor (NMOS) transistor.

4. A level shifter circuit, comprising:
   a level shifter, comprising:
      a first transistor and a second transistor respectively controlled by an input signal and an output signal to output an inversion output signal; and
      a third transistor and a fourth transistor respectively controlled by an inversion input signal and the inversion output signal to output the output signal;
   an inverter for receiving the input signal and thus generating the inversion input signal;
   a first switch circuit, which is coupled to the level shifter and turns off the fourth transistor when the third transistor is turned on; and
   a second switch circuit, which is coupled to the level shifter and turns off the second transistor when the first transistor is turned on, wherein the second switch circuit comprises:
      a sixth transistor controlled by the inversion output signal to output the input signal to the second transistor to turn off the second transistor.

5. The level shifter circuit according to claim 4, wherein the sixth transistor has a control terminal for receiving the inversion output signal, a first terminal coupled to a control terminal of the second transistor, and a second terminal for receiving the input signal.

6. The level shifter circuit according to claim 4, wherein the sixth transistor is an N-type metal oxidation semiconductor (NMOS) transistor.

7. A level shifter circuit, comprising:
   a level shifter, comprising:
      a first transistor and a second transistor respectively controlled by an input signal and an output signal to output an inversion output signal; and
      a third transistor and a fourth transistor respectively controlled by an inversion input signal and the inversion output signal to output the output signal;
   an inverter for receiving the input signal and thus generating the inversion input signal;
   a first switch circuit, which is coupled to the level shifter and turns off the fourth transistor when the third transistor is turned on, wherein the first switch circuit comprises:
      a fifth transistor; and
      a sixth transistor connected to the fifth transistor in series, wherein the fifth transistor and the sixth transistor are controlled by the output signal to output a power voltage to the fourth transistor to turn off the fourth transistor, and the inversion input signal is substantially equal to the power voltage when the sixth transistor is turned on; and
   a second switch circuit, which is coupled to the level shifter and turns off the second transistor when the first transistor is turned on.

8. The level shifter circuit according to claim 7, wherein control terminals of the fifth transistor and the sixth transistor receive the output signal, a first terminal of the fifth transistor is coupled to the fourth transistor, a second terminal of the fifth transistor is coupled to a first terminal of the sixth transistor, and a second terminal of the sixth transistor receives the power voltage.

9. The level shifter circuit according to claim 7, wherein the fifth transistor and the sixth transistor are N-type metal oxidation semiconductor (NMOS) transistors.

10. A level shifter circuit, comprising:
    a level shifter, comprising:
       a first transistor and a second transistor respectively controlled by an input signal and an output signal to output an inversion output signal; and
       a third transistor and a fourth transistor respectively controlled by an inversion input signal and the inversion output signal to output the output signal;
    an inverter for receiving the input signal and thus generating the inversion input signal;
    a first switch circuit, which is coupled to the level shifter and turns off the fourth transistor when the third transistor is turned on; and
    a second switch circuit, which is coupled to the level shifter and turns off the second transistor when the first transistor is turned on, wherein the second switch circuit comprises:

a seventh transistor; and an eighth transistor connected to the seventh transistor in series, wherein the seventh transistor and the eighth transistor are controlled by the inversion output signal to output a power voltage to the second transistor to turn off the second transistor, and the input signal is substantially equal to the power voltage when the eighth transistor is turned on.

11. The level shifter circuit according to claim 10, wherein control terminals of the seventh transistor and the eighth transistor receive the inversion output signal, a first terminal of the seventh transistor is coupled to the second transistor, a second terminal of the seventh transistor is coupled to a first terminal of the eighth transistor, and a second terminal of the eighth transistor receives the power voltage.

12. The level shifter circuit according to claim 10, wherein the seventh transistor and the eighth transistor are NMOS transistors.

* * * * *